United States Patent [19]

Thomas et al.

[11] Patent Number: 4,707,456

[45] Date of Patent: Nov. 17, 1987

[54] METHOD OF MAKING A PLANAR STRUCTURE CONTAINING MOS AND BIPOLAR TRANSISTORS

[75] Inventors: Mammen Thomas, San Jose; Matthew Weinberg, Mountain View, both of Calif.

[73] Assignee: Advanced Micro Devices, Inc., Sunnyvale, Calif.

[21] Appl. No.: 777,153

[22] Filed: Sep. 18, 1985

[51] Int. Cl.[4] .................... H01L 21/225; H01L 21/76
[52] U.S. Cl. ........................................ 437/59; 437/31; 437/34; 437/41; 437/162; 437/193; 437/194; 437/200; 156/644; 357/43; 357/59
[58] Field of Search ................. 148/1.5, 187, DIG. 9, 148/DIG. 10, DIG. 11, 53, 82, 122, 124; 156/644, 662; 29/571, 578, 576 W, 576 B; 357/43, 34, 59 H, 59 I, 59 G, 59 E

[56] References Cited

U.S. PATENT DOCUMENTS 4,319,954  3/1982  White et al. ...................... 156/628
4,343,082  8/1982  Lepselter et al. ................. 29/576 B
4,445,268  5/1984  Hirao ................................ 29/571
4,542,580  9/1985  Delivorias ........................ 29/590

FOREIGN PATENT DOCUMENTS

2148593  5/1985  United Kingdom ............ 29/576 W

Primary Examiner—Brian E. Hearn
Assistant Examiner—William Bunch
Attorney, Agent, or Firm—Patrick T. King; John P. Taylor

[57] ABSTRACT

A highly planarized integrated circuit structure having at least one bipolar device and at least one MOS device is described as well as a method of making the structure. The structure comprises a substrate having a field oxide grown thereon with portions defined therein respectively for formation of a collector region and a base/emitter region for a bipolar device and a source/gate/drain region for an MOS device. All of the contacts of the devices are formed using polysilicon which fills the defined portions in the field oxide resulting in the highly planarized structure.

17 Claims, 15 Drawing Figures

METHOD OF MAKING A PLANAR STRUCTURE CONTAINING MOS AND BIPOLAR TRANSISTORS

BACKGROUND OF THE INVENTION

1. Field of the Invention

This invention relates to integrated circuit structures. More particularly, this invention relates to an integrated circuit structure containing both an MOS device and a bipolar device and a method of constructing both devices on a substrate at the same time.

2. Description of the Prior Art

The use of MOS devices, in preference to bipolar devices, usually occurs when either the low power consumption or high density characteristics of MOS devices are needed or desired. However, an MOS device is usually constructed in a non planarized fashion with steps created when making contact with the source and drain regions which are lower than the gate region. Furthermore, despite the high density of the MOS devices, the gate contact usually occupies a large area due to the need to make the contact in a position offset to the gate region because of alignment problems.

In the construction of MOS devices, the source and drain junctions may be formed too deep causing the junctions to sometimes extend under the gate region causing overlap capacitance which degrades the performance of the device. The extension of the junction under the gate may be caused by forming the junction too deeply in the substrate. This can also cause the depletion region to extend sideways into the channel causing a short channel effect which further degrades the performance and functionality as well as long term reliability. If the source and drain regions can be formed as shallow junctions, which do not extend laterally, e.g., beneath the gate, the junction capacitance may also be lowered because of the reduction in the junction area.

On the other hand, bipolar devices may be chosen instead of MOS due to their high current carrying characteristics and superior transconductance. However, the use of an extrinsic base to provide interconnection between the intrinsic base and the base contact adds undesirable resistance as well as additional capacitance to the device which degrades performance. Furthermore, the construction of bipolar devices on a substrate can also result in the creation of undesirable steps resulting in the need for further planarization steps.

In many instances, it would be most desirable to use both types of devices in an integrated circuit structure to achieve certain desired effects, e.g., fast logic and low power storage. However, this may be difficult due to the differences in the techniques which have evolved to construct bipolar and MOS devices; particularly when such techniques may be addressed toward remedying a problem which is peculiar to one particular device.

It would, therefore, be very desirable to be able to construct both bipolar and MOS devices on the same substrate and to be able to construct the devices in a manner which would address the problems of the particular devices discussed above including the construction of a planarized integrated circuit structure incorporating such devices therein.

SUMMARY OF THE INVENTION

It is, therefore, an object of this invention to provide an improved integrated circuit structure containing both bipolar and MOS devices therein.

It is another object of this invention to provide an improved integrated circuit structure containing both bipolar and MOS devices therein characterized by low capacitance between the elements of the devices to thereby improve performance.

It is yet another object of this invention to provide an improved integrated circuit structure containing both bipolar and MOS devices therein which is further characterized by a highly planarized structure.

It is a further object of this invention to provide an improved integrated circuit structure containing both bipolar and MOS devices therein having self aligned contacts to reduce misalignment of contacts and reduce the contact area.

It is yet a further object of this invention to provide a method for efficiently constructing such an improved integrated circuit structure containing both bipolar and MOS devices therein.

These and other objects of the invention will be apparent from the following description and accompanying drawings.

In accordance with the invention a highly planarized integrated circuit structure having at least one bipolar device and at least one MOS device comprises a substrate having a field oxide grown thereon with portions defined therein respectively for formation of a collector region and a base/emitter region for a bipolar device and a source/gate/drain region for an MOS device. All of the elements of the devices are formed using polysilicon which fills the defined portions in the field oxide resulting in the highly planarized structure.

DESCRIPTION OF THE PREFERRED EMBODIMENTS

The invention provides for a highly planarized integrated circuit structure containing both bipolar and MOS devices which may be constructed substantially at the same time.

Figure 1:
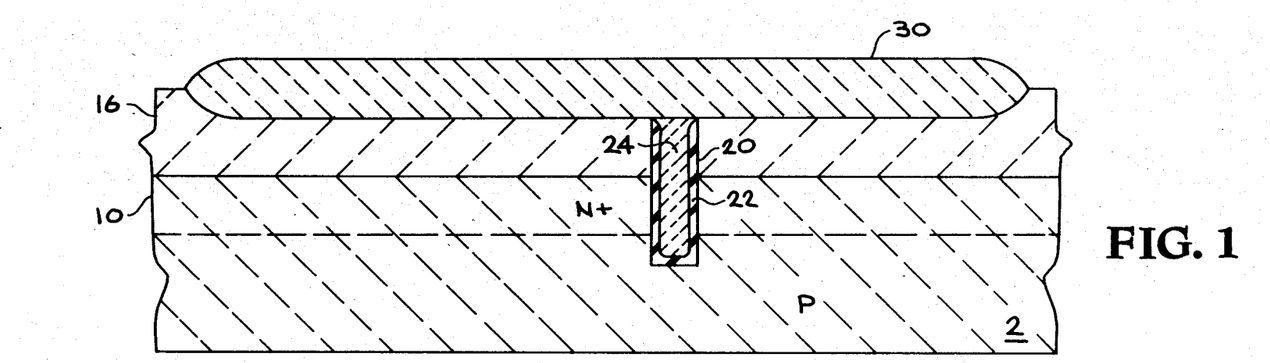
FIG. 1 is a fragmentary vertical cross-sectional view illustrating an early step in the construction of an embodiment of the invention.
Figure 2:
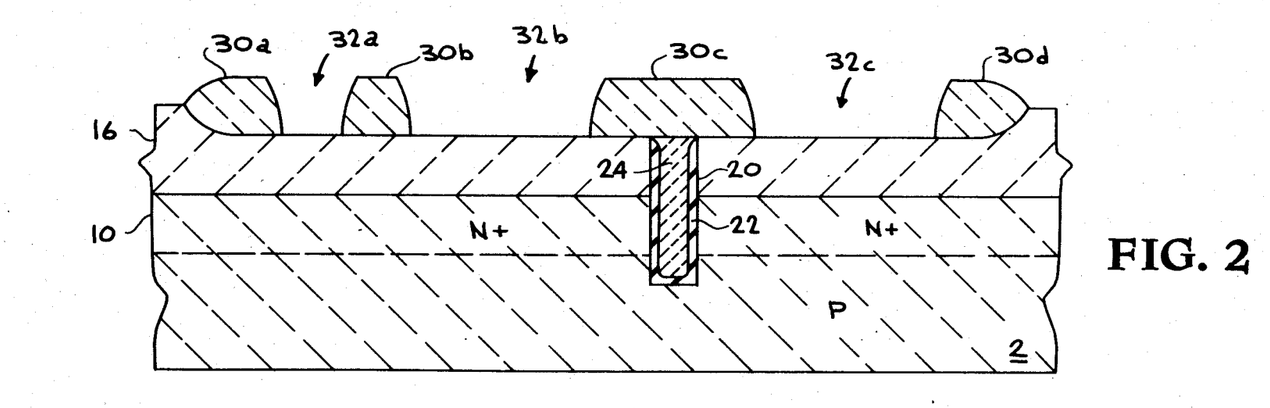
FIGS. 2–10 are fragmentary vertical cross-sectional views of subsequent steps in the construction of the embodiment of FIG. 1.
Figure 3:
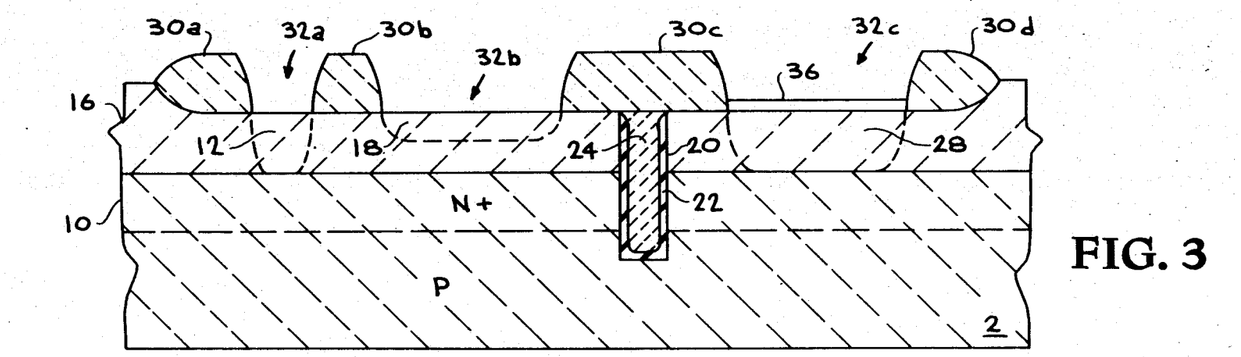

Referring to FIG. 1, a buried N+ layer 10 is conventionally formed in a P type silicon substrate 2 to provide the buried collector for the bipolar transistor. While layer 10 is shown extending across the entire substrate, which includes the region on which the MOS devices will be constructed, it may be bounded by appropriate masking, if desired, to extend only under the bipolar regions of the structure. However, extension of buried layer 10 underneath the MOS device to be formed provides greater alpha particle immunity and latch-up protection to the MOS device. After formation of buried layer 10, a layer 16 of epitaxial silicon is grown over layer 10.

As further shown in FIG. 1, an isolation slot 20 may then be cut through epitaxial layer 16 and buried layer 10 and partially into substrate 2 to provide isolation between the devices to be formed. A 2000 Angstrom layer of isolation oxide 22 may be grown in slot 20 after which slot 20 may be filled with polysilicon 24. Field oxide 30 is then grown over epitaxial layer 16, including slot 20, in the region where the active devices will be formed.

It should be noted here, that while a slot type of isolation is illustrated here, other forms of isolation such as isoplanar or junction isolation may also be used in connection with the practice of this invention.

After growth or deposition of field oxide layer 30, the structure is masked and etched to define, in layer 30, a collector contact region 32a, a base/emitter region 32b, and an MOS region 32c leaving the remaining portions 30a, 30b, 30c, and 30d of field oxide layer 30 bounding these regions. Then a 200-400 Angstrom gate oxide layer 36 is formed over the portion of epi layer 16 exposed in regions 32a, 32b, and 32c.

At this stage, a P well 28 may be implanted into epi layer 16 in the MOS region 32c if an N channel MOS device is to be formed. The bipolar regions 32a and 32b should be masked during this implant. Alternatively, P well 28 may be implanted immediately after formation of isolation slot 20 and before field oxide layer 30 is grown. The P well is then completely walled against the slot.

The MOS region 32c and collector region 32a are then masked to permit implantation of a P base into substrate 16 for the bipolar transistor. Following this, the bipolar base/emitter region 32b and the MOS regions 32c are masked and an N+ implantation is made through collector opening 32a into epi layer 16 to form sinker 12 to provide communication with buried layer 10.

It should be noted here that while separate masking steps and implantations are described for formation of the P well in the MOS region and the P base in the bipolar region to thereby permit optimization of the respective implant doses, it is within the scope of the invention to form both regions with a single implant.

Figure 4:
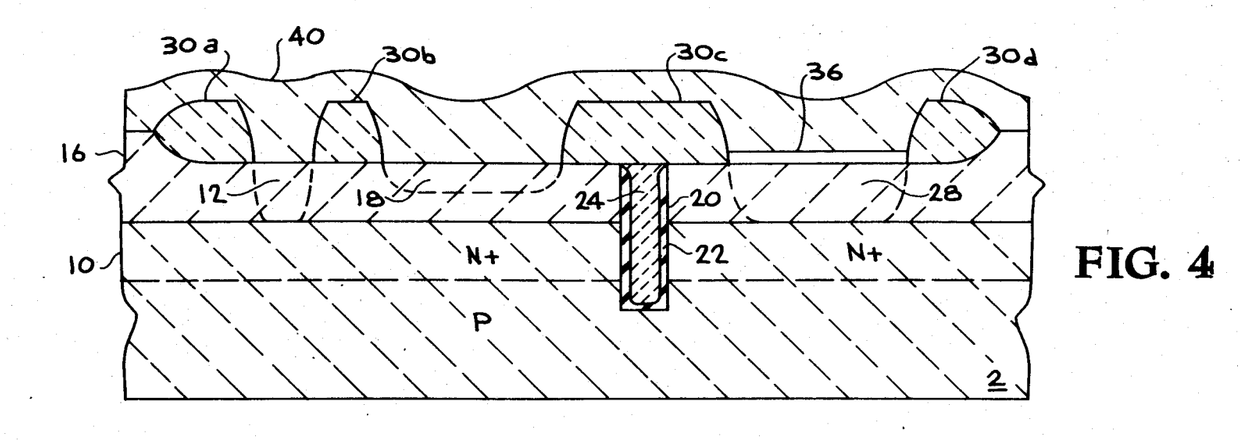
Figure 5:
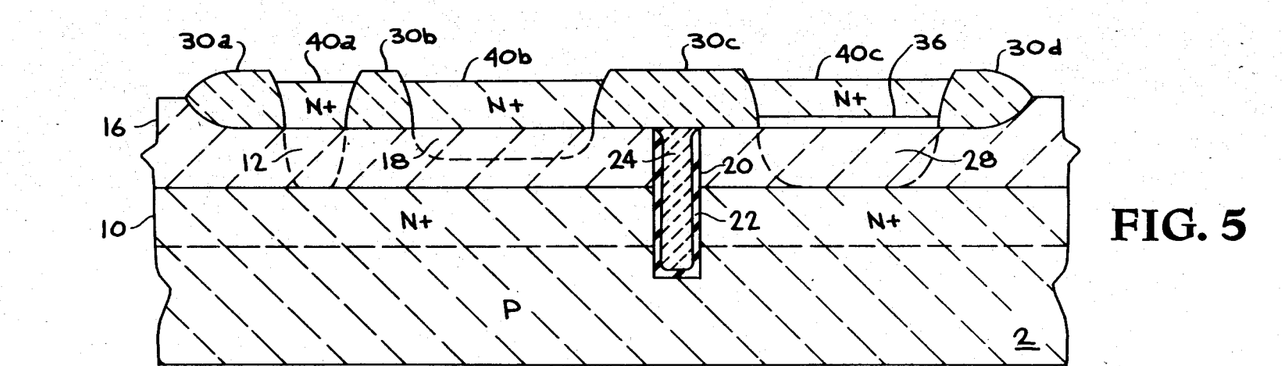

A mask, covering only the MOS area 32c, is now put on to permit removal of gate oxide layer 36 in the bipolar regions 32a and 32b. As shown in FIGS. 4 and 5, a layer 40 of polysilicon is now applied, planarized by polishing or etching back to the level of oxide segments 30a–30d, and then further etched down about 2000 Angstroms below the oxide surface. The polysilicon is then given an N+ implant as shown in FIG. 5.

Figure 6:
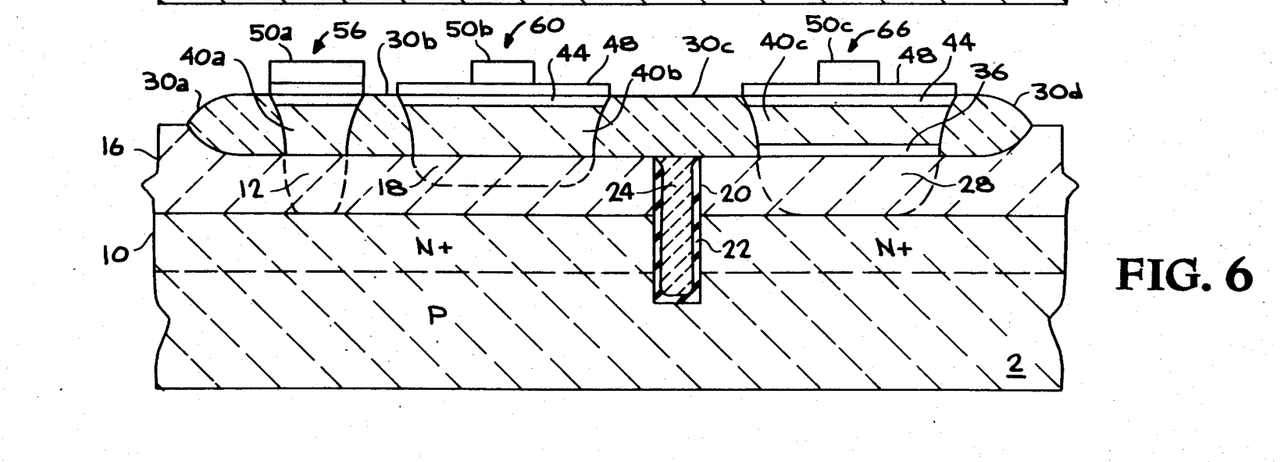

A masking layer of nitride 44 is applied over polysilicon layer 40 and an oxide layer 48 is formed over nitride layer 44. It should be noted at this point that the provision of oxide mask portion 48 over nitride mask 44 permits subsequent planarization to be performed since the oxide 48 serves to prevent the underlying nitride mask 44 from being polished away. The oxide/nitride layers are then masked at 50a, 50b, and 50c in FIG. 6 conforming, respectively, to a collector contact region generally indicated at 56, a emitter contact region generally indicated at 60, and a gate contact region generally indicated at 66. The remainder of the oxide/nitride mask is then removed as well as the underlying polysilicon down to epitaxial layer 16 leaving polysilicon portions 40a, 40b, and 40c conforming to the respective collector contact, emitter, and gate contact portions. The exposed portions of gate oxide layer 36 are also preferably removed at this point.

Figure 7:
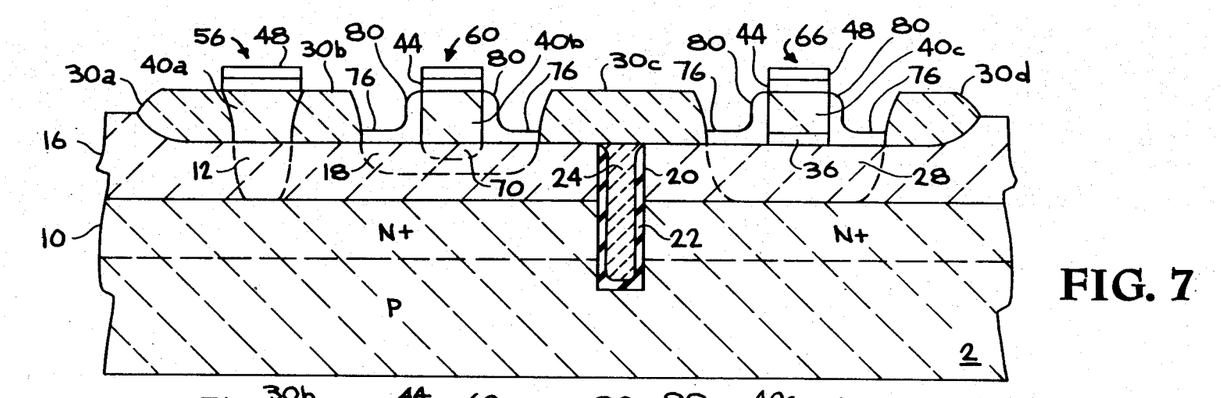

As shown in FIG. 7, thermal oxide may now be grown over the exposed epitaxial silicon and polysilicon by heating the structure to about 900° C. for about 20 to 30 minutes. This also permits diffusion from polysilicon emitter contact portion 40b into epitaxial layer 16 to form emitter region 70. The oxide grows on the epi layer at 76 at a slower rate than the oxide 80 on the highly doped polysilicon portions 40b and 40c. Oxide 76 is allowed to reach a thickness of about 1500 Angstroms which results in a growth of about 4000 Angstroms for the oxide 80 on polysilicon portions 40b and 40c.

Figure 8:
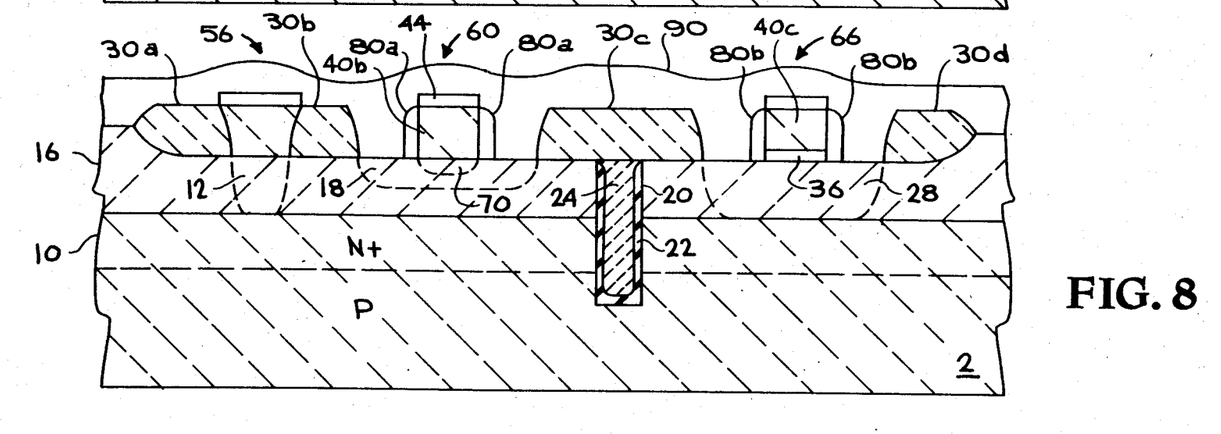

The structure is now exposed to a reactive ion etch (RIE) to remove the oxide portions 76 over the epi layer 16 leaving oxide spacers 80a and 80b respectively on the polysilicon sidewalls of emitter contact portion 40b and gate contact portion 40c as seen in FIG. 8.

Alternatively, low pressure chemical vapor deposited glass (LPCVD glass) may be deposited over the exposed epitaxial silicon and polysilicon in which case emitter region 70 may be formed in epitaxial layer 16 by a short drive in an inert ambient, e.g., 1000° C. for 10 minutes in a nitrogen atmosphere. The glass is then selectively removed to leave only the oxide spacers 80a and 80b, again using an RIE to remove the remainder of the glass with the etch time adjusted accordingly.

Figure 9:
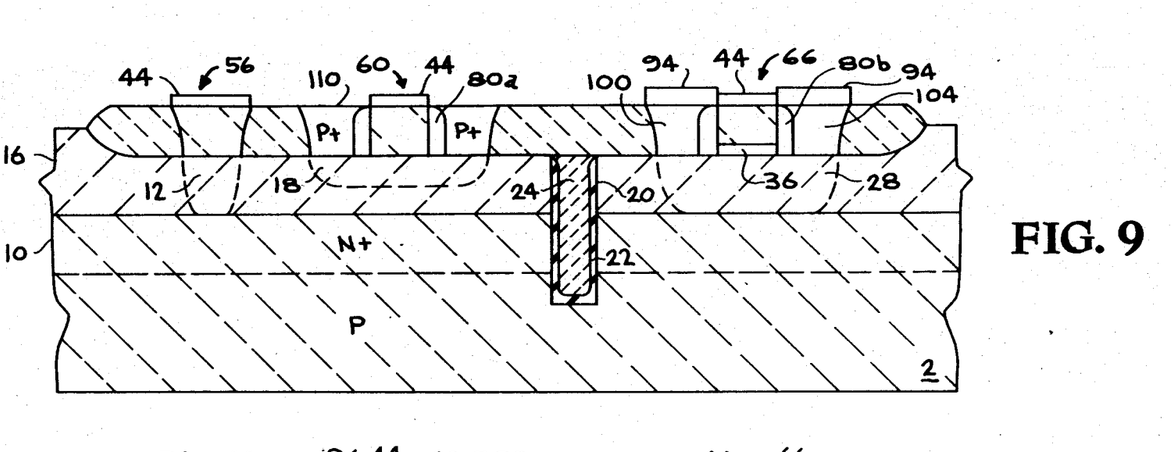

Another layer 90 of polysilicon is now applied over the structure (FIG. 8) and then planarized, either by etching or mechanical polishing, as shown in FIG. 9. The portions of polysilicon layer 90 over the NMOS structure are masked at 94 and a P+ implantation is carried out to form the base contact regions. The bipolar region is then masked at 96 in FIG. 10 and an N+ implantation is carried out in source contact portion 100 and drain contact portion 104.

Figure 10:
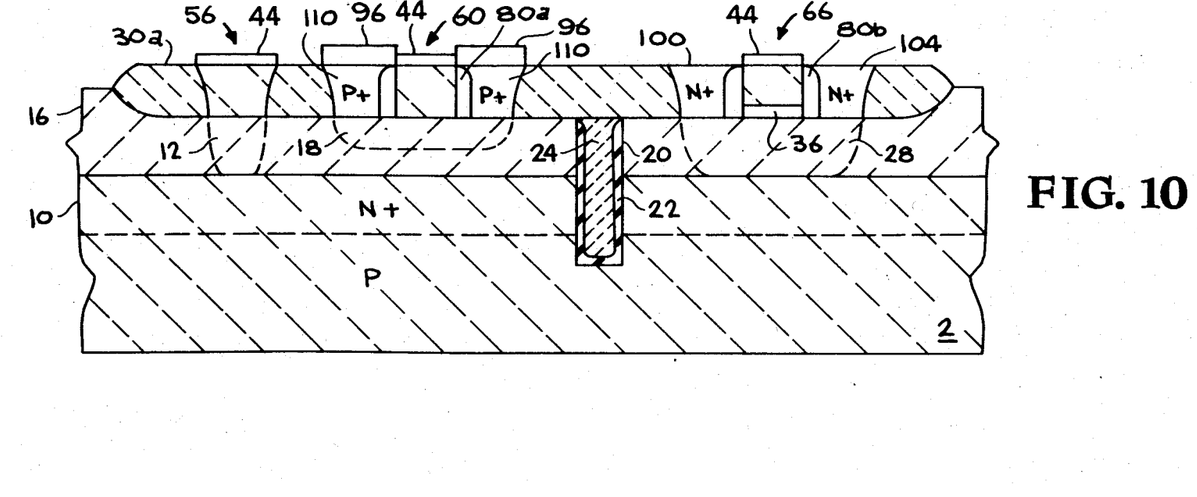
Figure 11:
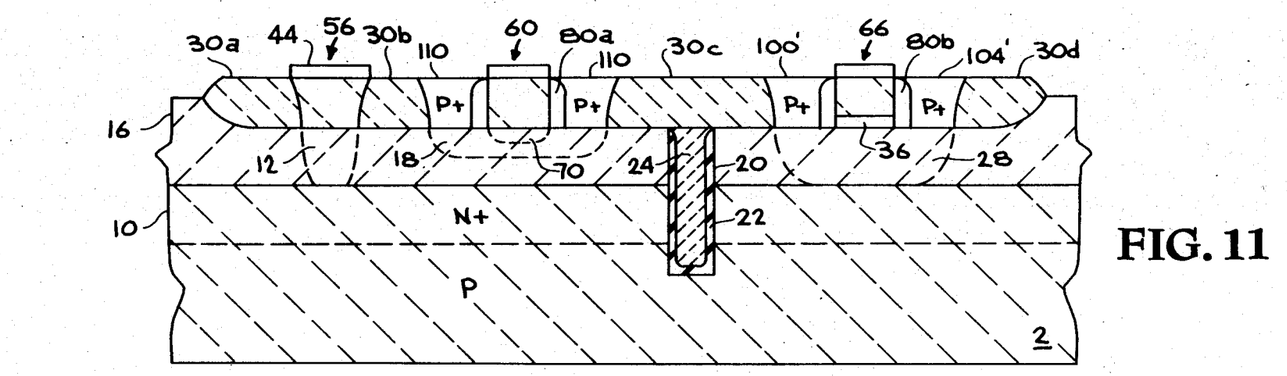
FIG. 11 is a fragmentary vertical cross-sectional view of an alternate procedure to that of FIGS. 9 and 10 when a P channel device is constructed.
Figure 12:
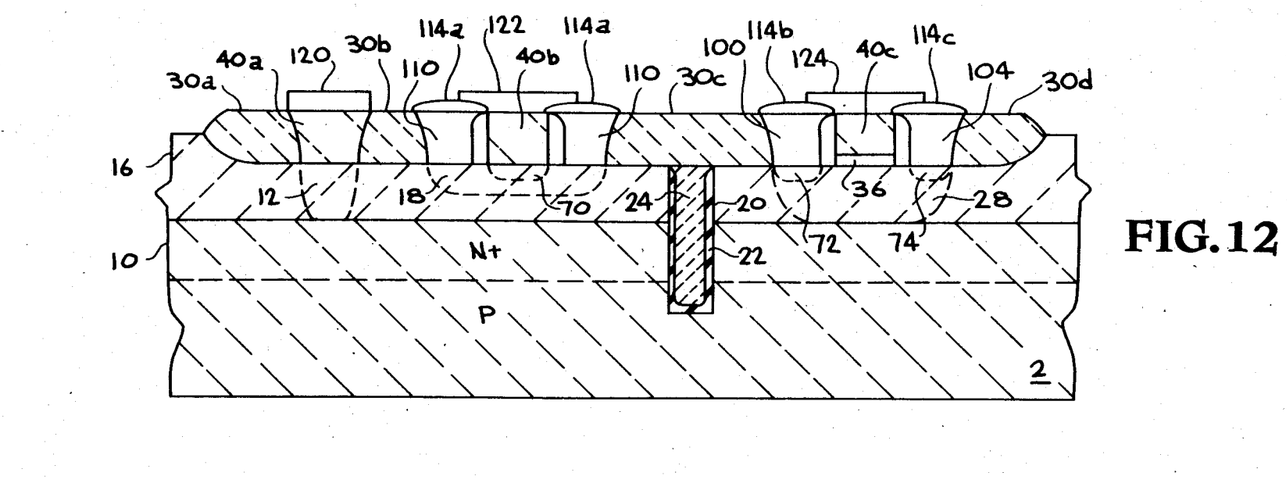
FIGS. 12 and 13 are fragmentary vertical cross-sectional views of the final processing steps in the construction of the embodiment of FIG. 1.

The foregoing step by step procedures, up to FIG. 9, have illustrated the formation of an integrated circuit structure having a bipolar device and an N channel (NMOS) device, which, but for the initial formation of the P well, would be the same as that of a bipolar and PMOS construction. However, the steps shown in FIGS. 9 and 10 are peculiar to the construction of an NMOS device. FIG. 11 illustrates an alternate procedure to that of FIGS. 9 and 10 when a P channel (PMOS) device is formed. In this instance, both the base contact region 110 and the source and drain contact regions 100' and 104' are formed by a P+ implantation and therefore no masks are necessary. When CMOS structures are to be constructed the NMOS structure will be masked at this point during the P+ implantation to form the base contact region of the bipolar device and the source and drain contact regions of the PMOS device. The bipolar region and the PMOS region are then masked during the N+ implantation to form the NMOS source and drain contact regions.

After the respective implantations, the structure may be heated to a temperature of 900° C. for 20 to 30 minutes to permit diffusion of the respective implantations into the underlying epi layer 16 to form source region 72, drain region 74, and extrinsic base region 18, and, at the same time, to grow an oxide layer 114 over base contacts 110, source contact 100, and drain contact 104.

Alternatively, the structure may be subject to a Rapid Thermal Anneal, e.g., about 6 seconds exposure to high energy, such as high intensity UV, to achieve the desired shallow junctions, followed by low temperature oxidation. It should be noted here that, in accordance with the invention, it is only necessary to lightly diffuse the dopants into epi layer 16 to form the rspective source, drain, and extrinsic base regions as will be seen below.

After the base, source, and drain contact implantations, and the diffusion and oxidation step, nitride mask 44 is removed from the top of the collector, emitter, and gate contacts. A collector mask 120 is then applied over collector contact 40a, an oversized emitter mask 122 is applied over emitter contact 40b, and an oversized gate mask 124 is applied over gate contact 40c. It will be noted that oversized emitter mask 122 overlaps a portion of adjoining oxide 114a while oversized gate mask overlaps adjoining oxide 114b and 114c.

Figures 13, 14:
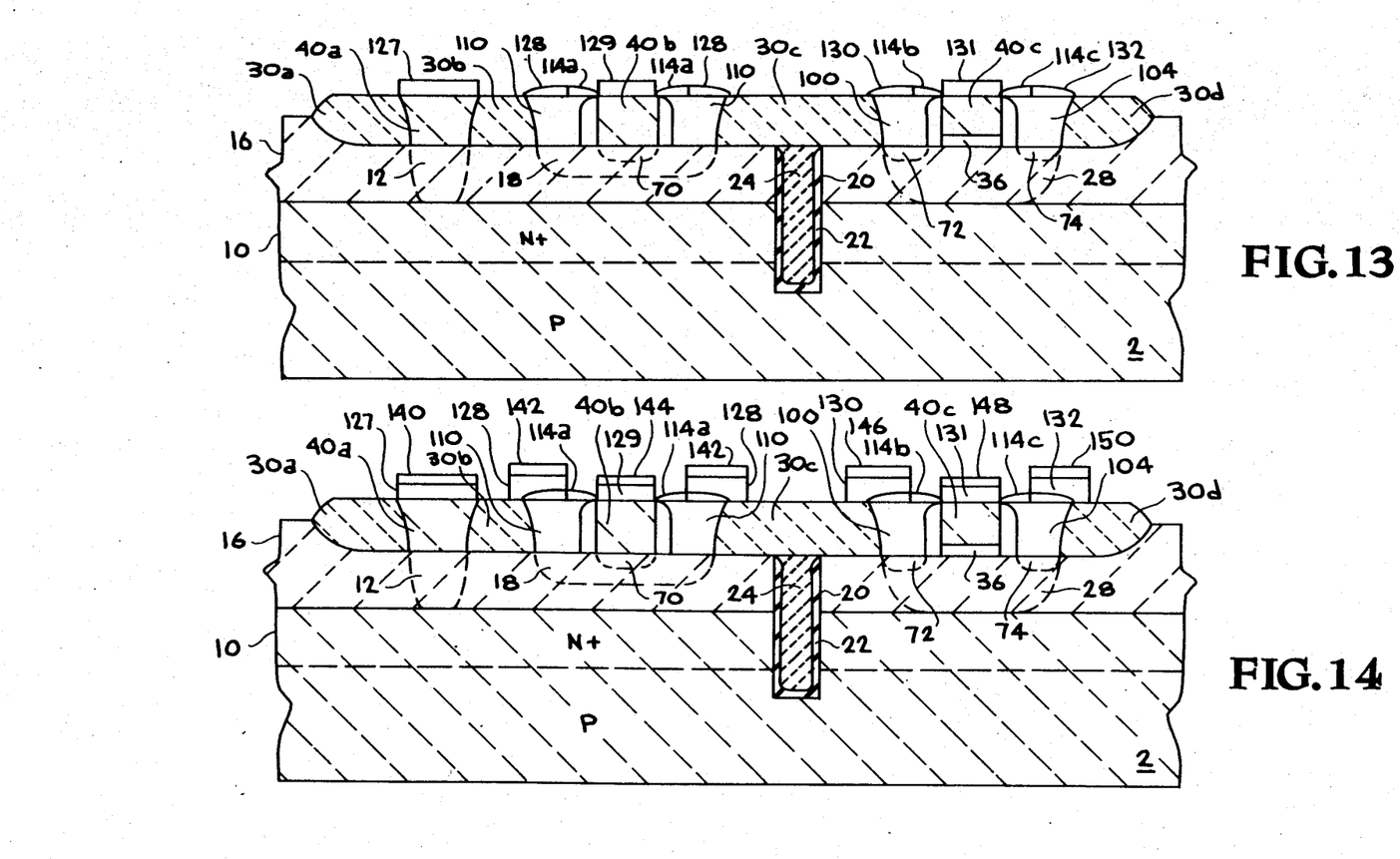
FIG. 14 is a fragmentary vertical cross-sectional view of the completed structure of the invention.

The remaining, exposed portions of oxide 114a, 114b, and 114c are now removed by etching or the like. Masks 120, 122, and 124 are also removed and a metal capable of forming a silicide with the now exposed polysilicon, e.g., titanium or platinum, is applied. The structure is heated to a temperature of about 500° C. for about 15 to 30 minutes to permit the metal to react with the polysilicon to form the corresponding collector contact silicide portion 127, base contact silicide portion 128, emitter contact silicide portion 129, source silicide portion 130, gate contact silicide portion 131, and drain silicide portion 132 as shown in FIG. 13.

Figure 15:
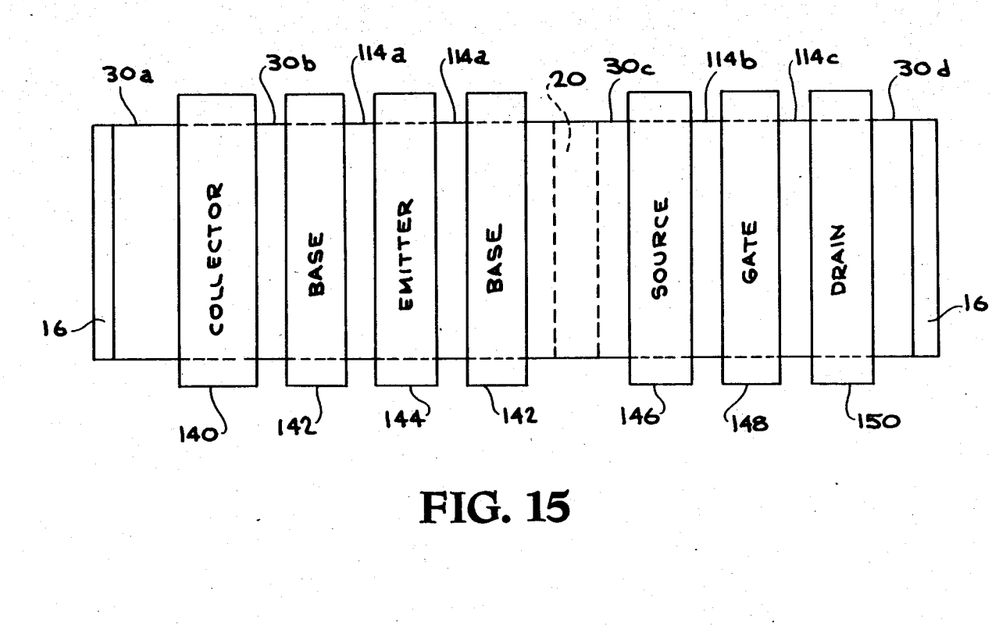
FIG. 15 is a top view of the completed structure of the invention shown in FIG. 14.

The surface is then coated with a conductor such as, for example, a 0.8 micron layer of aluminum. The conductor is then masked and selectively etched using conventional techniques to form the respective metal contact strips 140-150 as shown in FIGS. 14 and 15.

The result is a highly planarized structure containing both bipolar and MOS devices. The provision of the silicide layer over the source and drain polysilicon contacts provides lower sheet resistance. Furthermore the shallow source and drain junctions formed because of the polysilicon contacts reduces short channel effects as well. Since the junction area is low, the junction capacitance of the MOS device will likewise be reduced.

The bipolar device may be provided with a very shallow extrinsic base because of the polysilicon contacts. Furthermore, the presence of the oxide spacers adjacent the raised polysilicon emitter reduces the path in the extrinsic base from the emitter to the base polysilicon contact. This reduces resistance as well as capacitance thus enhancing the performance of the device. The use of a polysilicon emitter in the bipolar device raises the gain of the device.

Finally, the use of self-aligned contacts and a highly planarized construction design produces a compact structure with the contacts spaced close together and permits reduction of the contact size resulting in higher density.

Having thus described the invention, what is claimed is:

1. A method of forming a highly planarized integrated circuit structure containing one or more bipolar devices and one or more MOS devices which comprises:
    (a) forming a buried layer in at least a portion of a substrate parallel to at least a first surface thereon;
    (b) forming an isolation zone in said substrate generally perpendicular to said first surface and extending into said substrate from said first surface to a point below said buried layer;
    (c) forming an oxide layer on said first surface of said substrate;
    (d) removing selective portions of said oxide layer to form openings therein extending to said first surface of said substrate;
    (e) forming portions of said one or more bipolar devices and MOS devices in said openings including the steps of:
        (1) first forming a gate oxide over said substrate;
        (2) depositing a layer of doped polysilicon over said structure;
        (3) planarizing said structure to provide doped polysilicon in said openings to a level approximately equal to the top of said oxide layer to thereby form a highly planarized surface on said integrated circuit structure;
        (4) applying one or more masking layers over said doped polysilicon; and
        (5) selectively removing portions of said doped polysilicon deposited in said openings in said oxide layer to respectively form an emitter contact portion, and a gate contact portion.

2. A method of forming a highly planarized integrated circuit structure containing one or more bipolar devices and one or more MOS devices which comprises:
    (a) forming a buried layer in at least a portion of a substrate parallel to at least a first surface thereon;
    (b) forming an isolation zone in said substrate generally perpendicular to said first surface and extending into said substrate from said first surface to a point below said buried layer;
    (c) forming an oxide layer on said first surface of said substrate;
    (d) removing selective portions of said oxide layer to form openings therein extending to said first surface of said substrate;
    (e) forming portions of said one or more bipolar devices and MOS devices in said openings by first forming a gate oxide over said substrate, then depositing doped polysilicon over said structure, and then planarizing the structure to provide doped polysilicon in said openings to a level approximately equal to the top of said oxide layer to thereby form a highly planarized surface on said integrated circuit structure; and
    (f) selectively removing portions of said doped polysilicon deposited in said openings in said oxide layer to respectively form an emitter contact portion, and a gate contact portion.

3. The method of claim 2 including the further steps of applying one or more masking layers over said doped polysilicon prior to said selective removal of polysilicon.

4. The method of claim 3 wherein said step of selective removal of said polysilicon to form emitter and gate contact portions results in the formation of raised portions of polysilicon on said substrate surface.

5. The method of claim 4 including the further step of forming oxide spacer members on the sidewalls of said raised polysilicon emitter and gate contact portions.

6. The method of claim 5 wherein said step of forming said oxide spacers on the sidewalls of said polysilicon emitter and gate contact portions comprises filling with oxide the openings left by said selective removal of polysilicon and then selectively removing a portion of said oxide.

7. The method of claim 6 including the further step of removing said portions of said oxide with a reactive ion etch.

8. The method of claim 7 including the further steps of applying another layer of polysilicon over said structure and then planarizing the structure to thereby fill with polysilicon the openings left by said selective removal of said oxide.

9. The method of claim 8 including the further step of doping said polysilicon used to fill said openings formed by said selective removal of oxide to thereby respectively form base contact portions adjacent said oxide spacers on said raised emitter and source and drain contact portions adjacent said oxide spacers on said raised gate.

10. The method of claim 9 including the further steps of masking NMOS regions on said integrated circuit structure during P doping of said polysilicon to form said base contact portion and PMOS source and drain contact portions and masking PMOS regions and bipolar regions of said integrated circuit structure during N doping of said polysilicon to form NMOS source and drain portions.

11. The method of claim 10 including the further steps forming a protective oxide layer over said source, drain, and base contacts and forming source, drain and base regions in said epitaxial layer beneath the respective contacts.

12. The method of claim 11 wherein said structure is heated to a temperature of about 900° C. for about 20 to 30 minutes to form said protective oxide and to diffuse dopant from said source, drain, and base contacts into said epitaxial layer.

13. The method of claim 12 wherein said structure is subject to a rapid thermal anneal to form said source, drain and base regions in said epitaxial layer beneath said respective contacts.

14. The method of claim 11 including the further steps of forming oversized masks over said collector, emitter, and gate contact portions, after formation of said source, drain, and base contact portions, which will overlap a portion of said protective oxide on said source, drain, and base contact portions; removing the remaining portions of said protective oxide; removing the oversize masks; and forming a metal silicide in the surface of the now exposed portions of said source, drain, gate, emitter, collector, and base contact portions to provide low resistance lateral current paths in said structure, and whereby said structure will be provided with self-aligned contacts.

15. The method of claim 14 including the further step of forming conductive metal contacts over said structure in respective electrical contact with said collector, base, emitter, source, gate, and drain contact portions in said structure.

16. A method of forming a highly planarized integrated circuit structure containing one or more bipolar devices and one or more MOS devices which comprises:
(a) forming a buried layer in at least a portion of a substrate parallel to at least a first surface thereon;
(b) forming an epitaxial layer on said substrate over said buried layer;
(c) forming an isolation zone in said substrate generally extending into said substrate from said first surface to a point below said buried layer;
(d) forming an oxide layer on said first surface of said substrate;
(e) removing selective portions of said oxide layer to form openings therein extending to said first surface of said substrate;
(f) growing a gate oxide layer over exposed portions of said substrate;
(g) selectively doping portions of said epitaxial layer to form portions of said devices in said substrate;
(h) depositing a first layer of polysilicon on said structure to fill said openings;
(i) doping said first polysilicon layer; and
(j) forming portions of said one or more bipolar devices and MOS devices in said openings by planarizing said polysilicon to provide doped polysilicon in said openings to a level approximately equal to the top of said oxide layer to thereby form a highly planarized surface on said integrated circuit structure.

17. A method of forming a highly planarized integrated circuit structure containing one or more bipolar devices and one or more MOS devices which comprises:
(a) forming a buried layer in at least a portion of a substrate parallel to at least a first surface thereon;
(b) forming an epitaxial layer on said substrate over said buried layer;
(c) forming an isolation zone in said substrate generally extending into said substrate from said first surface to a point below said buried layer;
(d) forming a first oxide layer on said first surface of said substrate;
(e) removing selective portions of said first oxide layer to form openings therein extending to said first surface of said substrate;
(f) growing a gate oxide layer over exposed portions of said substrate;
(g) selectively doping portions of said epitaxial layer to form portions of said devices in said substrate;
(h) depositing a first layer of polysilicon on said structure to fill said openings;
(i) doping said first polysilicon layer;
(j) planarizing said first polysilicon layer to a level at least equal to or slightly below portions of said first oxide layer adjacent said openings;
(k) masking said doped polysilicon to define collector, emitter, and gate contact portions;
(l) selectively removing polysilicon adjacent said masked emitter and gate contact portions to expose sidewall portions thereof;
(m) forming a second oxide layer over said structure including said exposed sidewalls of said emitter and gate contact portions;
(n) selectively removing said second oxide from said substrate while leaving portions of said second oxide layer adjacent said polysilicon sidewalls of said emitter and gate contact portions;
(o) forming a second polysilicon layer over said structure to fill said openings formed by said selective removal of portions of said second oxide layer;
(p) planarizing said second polysilicon layer;
(q) selectively doping said second polysilicon layer to form base, source, and drain contact portions therein; and
(r) forming base, emitter, source, and drain regions in said substrate beneath said contact portions.

* * * * *